(12) United States Patent
Jiang et al.

(10) Patent No.: US 12,298,338 B2
(45) Date of Patent: May 13, 2025

(54) PARTIAL DISCHARGE DETECTING METHOD USING ULTRAVIOLET IMAGERY UNDER PULSE VOLTAGE CONDITION

(71) Applicant: Nanjing University Of Aeronautics & Astronautics, Nanjing (CN)

(72) Inventors: Jun Jiang, Nanjing (CN); Bendong Zhang, Nanjing (CN); Zhibang Shen, Nanjing (CN); Chaohai Zhang, Nanjing (CN)

(73) Assignee: Nanjing University Of Aeronautics & Astronautics, Nanjing (CN)

( * ) Notice: Subject to any disclaimer, the term of this patent is extended or adjusted under 35 U.S.C. 154(b) by 190 days.

(21) Appl. No.: 18/125,579

(22) Filed: Mar. 23, 2023

(65) Prior Publication Data
US 2023/0305051 A1    Sep. 28, 2023

(51) Int. Cl.
*G01R 31/12* (2020.01)
*G06T 5/30* (2006.01)
*G06T 5/70* (2024.01)
*G06T 7/00* (2017.01)
*G06T 7/155* (2017.01)

(52) U.S. Cl.
CPC ......... *G01R 31/1218* (2013.01); *G01R 31/12* (2013.01); *G01R 31/1227* (2013.01); *G06T 5/30* (2013.01); *G06T 5/70* (2024.01); *G06T 7/0002* (2013.01); *G06T 7/155* (2017.01); *G06T 2207/10016* (2013.01); *G06T 2207/10024* (2013.01); *G06T 2207/20021* (2013.01); *G06T 2207/20036* (2013.01); *G06T 2207/20192* (2013.01)

(58) Field of Classification Search
CPC .............. G01R 31/1218; G01R 31/12; G01R 31/1227; G06T 5/30; G06T 5/70; G06T 7/0002; G06T 7/155; G06T 2207/10016; G06T 2207/10024; G06T 2207/20021; G06T 2207/20036; G06T 2207/20192
See application file for complete search history.

(56) References Cited

U.S. PATENT DOCUMENTS

2003/0122743 A1    7/2003    Suzuki

FOREIGN PATENT DOCUMENTS

CN    103744005 A   *   4/2014

* cited by examiner

*Primary Examiner* — Amy He
(74) *Attorney, Agent, or Firm* — NIXON PEABODY LLP

(57) ABSTRACT

A partial discharge detecting method using ultraviolet imagery under pulse voltage condition is discussed. The method samples video data at a partial discharge area of a target electric system by an ultraviolet imager, obtains an ultraviolet image by extracting video frames from the video data, obtains a discharge intensity data P based on a sum number of pixels with a brightness value higher than a brightness threshold in the ultraviolet image; and obtains a quantization result Q of the partial discharge of the target electric system based on the discharge intensity data P and discharge characteristic parameters.

8 Claims, 5 Drawing Sheets

(a) (b)

(c) (d)

PARTIAL DISCHARGE DETECTING METHOD USING ULTRAVIOLET IMAGERY UNDER PULSE VOLTAGE CONDITION

CROSS-REFERENCE TO RELATED APPLICATIONS

This application claims priority to and the benefit of Chinese Patent Application No. 202210295180.5, filed Mar. 24, 2022, which is incorporated herein by reference in its entirety.

BACKGROUND OF THE INVENTION

As the wide use of fast switch devices such as silicon carbide (SiC) and gallium nitide (GaN), large electrical stress caused by high variation of voltage (dv/dt) is applied at power electronic devices or at system electrical equipment. Compared with conventional sine waveforms or routine pulse waveforms, pulse voltages with high dv/dt shows a much shorter rising time, resulting in more severe electric field superposition. Thus, assessment and analysis to the insulation risk of the electric modules or systems under high dv/dt pulse voltage condition are necessary.

Several existing approaches are adopted to detect partial discharge phenomenon under routine high voltage condition: the pulse current detection, the high frequency current (HFCT) detection, the ultra-high frequency (UHF) detection and the ultrasonic detection. The method of pulse current detection characterized in high sensitivity, and intuitive and effective test result. But this method is weak in electromagnetic interference, leading an ideal environment requirement for the test. The method of HFCT detection has an adjustable bandwidth according to field applications. The HFCT has a sensor that is easy to be installed and carried by. But the signal to interference plus noise ratio of photo diode is sensitive to a slew rate when detecting partial discharge under pulse voltage. If the slew rate is higher than 1.2 KV/μs, the signal to interference plus noise ratio of the photo diode would dramatically fall down, whereas the pulse voltage with high dv/dt typically has a slew rate higher than 1.2 KV/μs. Especially when the pulse voltage has a frequency higher than 10 kHz, the noise signal detected by the HFCT would be far larger than the detected PD signal, causing the failure of HFCT detection. The method of UHF detection has high sensitivity. It is able to detect a signal with 0.5-0.8 pC (pico-coulomb) discharge magnitude. It can also effectively remove low frequency signal, remote orientate the fault location, and identify the insulation defect type. Thus, the method of UHF detection can provide more accurate evaluation on whether a partial discharge is happened at the equipment. But the UHF detection would be easily affected by the electromagnetic interference of ultra-high frequency, and is difficulty in detecting equipment fully sealed with metal. The method of ultrasonic detection adopts the principle of ultrasonic to sense partial discharge, which partly isolates the transmission and contact between electric signals. However, the ultrasonic detection is easily disturbed by nearby mechanical vibrations, and the signal has an attenuation problem. In addition, the detect probe and the trim unit may suffer from strong electric interference under conditions with the high dv/dt pulse voltage.

Thus, traditional electrical and ultrasonically detection method is hard to meet the test requirement under conditions with high dv/dt pulse voltage.

DETAILED DESCRIPTION OF THE INVENTION

Embodiments of partial discharge detection method are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
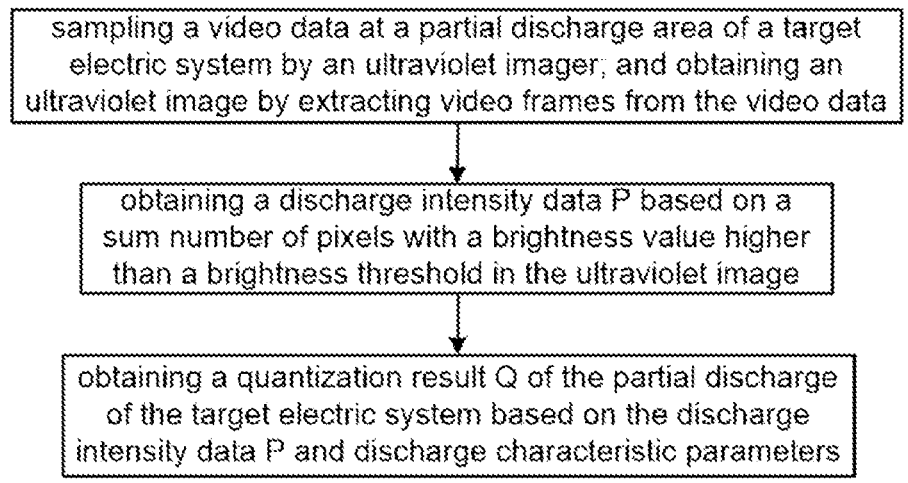
FIG. 1 schematically shows a flowchart of a partial discharge detection method using ultraviolet imagery under pulse voltage condition in accordance with an embodiment of the present invention.

FIG. 1 schematically shows a flowchart of a partial discharge detection method using ultraviolet imagery under pulse voltage condition in accordance with an embodiment of the present invention. The method comprises:

Step 1, sampling a video data at a partial discharge area of a target electric system by an ultraviolet imager; and obtaining an ultraviolet image by extracting video frames from the video data.

Partial discharge phenomenon exists at the partial discharge area of the target electric system with high dv/dt pulse voltage, where v represents a voltage information, and t represents a time information. High dv/dt pulse voltage refers to a pulse voltage that has a voltage variation higher than a preset threshold. The pulse voltage with high dv/dt typically has a high frequency, which is different from the power frequency voltage.

Because the particularity of situations with high dv/dt pulse voltage, the partial discharge phenomenon with high dv/dt pulse voltage is random. Accordingly, the present invention first sample the video data, and then extract video frames to obtain the ultraviolet image. Specifically, the ultraviolet imager has a sample time length $$T \geq \frac{100}{f},$$

wherein f represents a frequency of the pulse voltage with high dv/dt.

Figure 2:
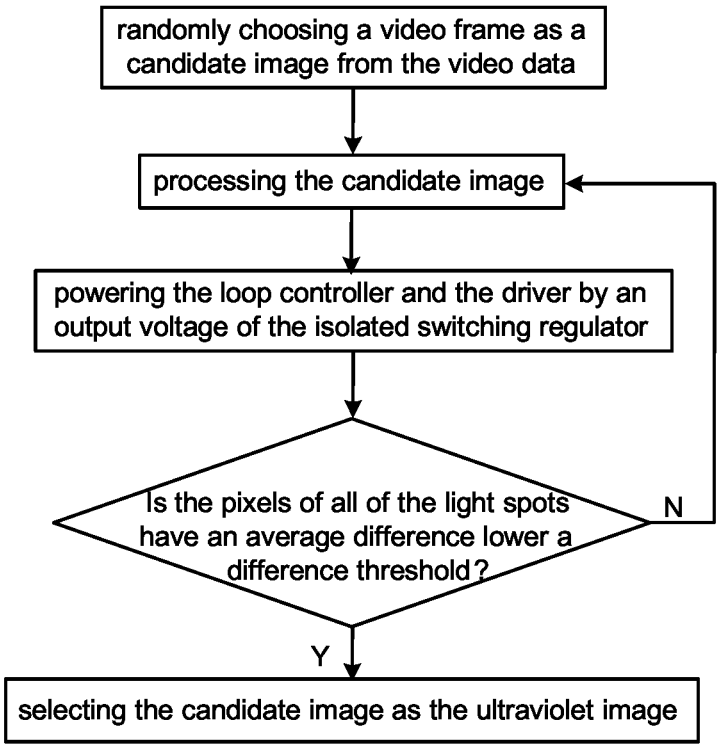
FIG. 2 schematically shows a method of extracting an ultraviolet image reflecting partial discharge situation after sampling the video data.
Figure 3:
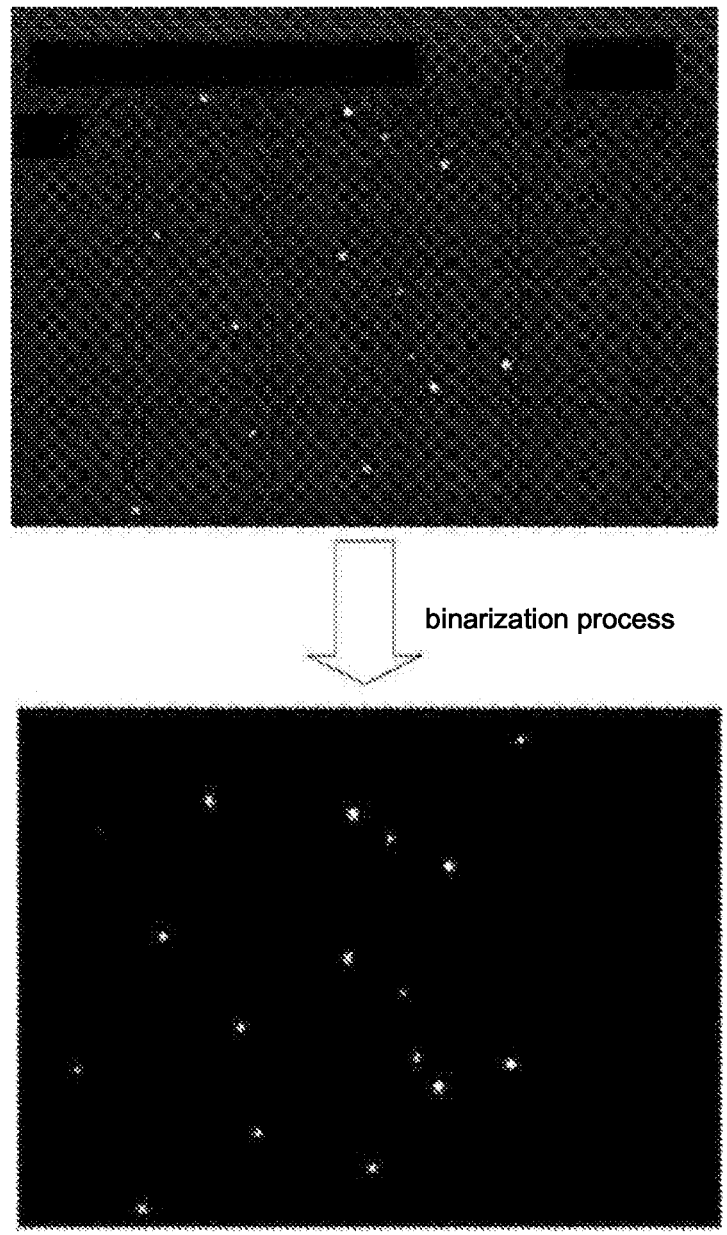
FIG. 3 schematically shows the grey images with and without binarization process.

FIG. 2 schematically shows a method of extracting an ultraviolet image reflecting partial discharge situation after sampling the video data. The method comprises:

Randomly choosing a video frame as a candidate image from the video data. Processing the candidate image to pick pixels having a brightness value higher than a brightness threshold, i.e., to detect a light spot. The process comprises two parts: a binarization process and a noise reduction process, as will be discussed below:

Converting the candidate image with RGB (red, green and blue) format into a grey image, which includes grey values of each of the pixels. Then setting the pixels having a grey value exceeding a grey threshold to 1 (i.e., as the light spot) in the grey image, and setting others to 0 (i.e. as a dark spot), to obtain a binary image and complete the binaration process. The binary images still have many noise spots. Thus, the binary image is further processed with noise reduction to improve the accuracy. Specifically, a morphology operation is performed on the binary image: the binary image is eroded by opening and closing operations, and an erosion result is then dilated to filter scatters with low pixels and smooth an image edge. Repeating the above actions, i.e. performing the opening & closing operation, dilation and erosion again, to eliminate image voids and keep the image edge smooth. FIG. 3 schematically shows the grey images with and without binarization process. The binary images may still have noise spot. Partial filter may be adopted to reduce the noise.

The pixels with brightness values higher than the brightness threshold, i.e., the light spots, and the pixels with brightness values lower than the brightness threshold, i.e., the dark spots, are accurately extracted by this way. If the pixels of all of the light spots have an average difference lower a difference threshold, the candidate image would be regarded as the ultraviolet image. Then step 2 would be performed. Otherwise, randomly choosing a video frame as a candidate image from the video data again, and re-performing above actions, until a qualified video frame is selected as the ultraviolet image.

Step 2, obtaining a discharge intensity data P based on a sum number of pixels with a brightness value higher than the brightness threshold in the ultraviolet image. Because the image process has been performed on the video frame before obtaining the ultraviolet image, the pixels with the brightness value higher than the brightness threshold, i.e., the light spot is distinguished from the dark spot.

Figure 4:
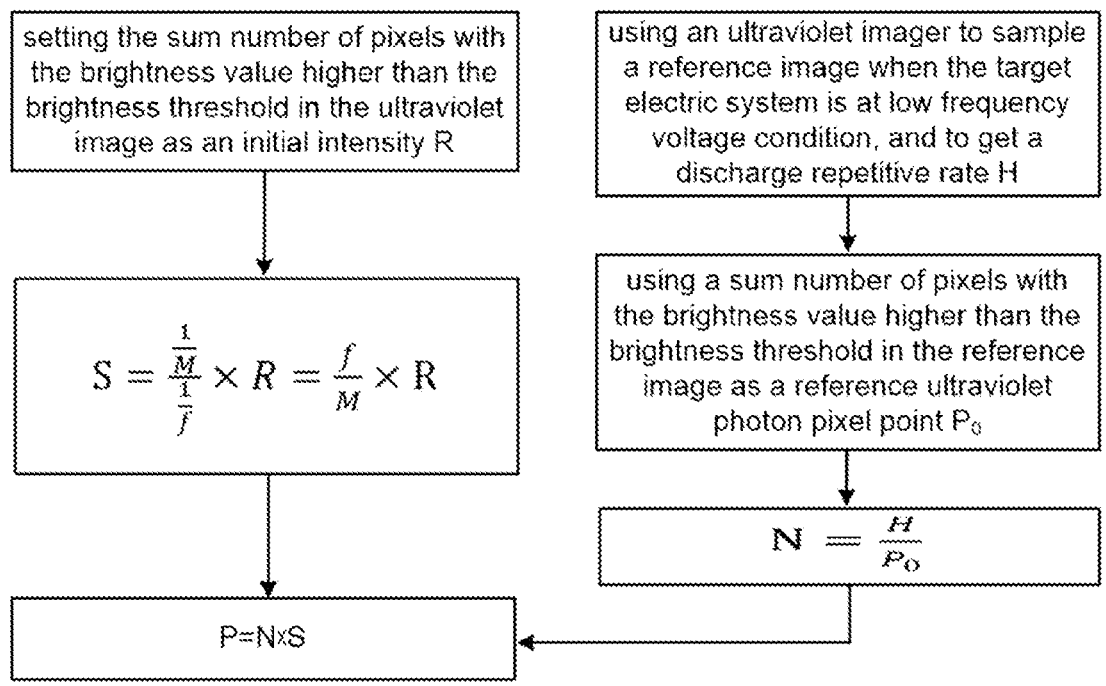
FIG. 4 schematically shows a flowchart of method obtaining a discharge intensity data in accordance with an embodiment of the present invention.

In one embodiment of the present invention, the sum number of pixels with the brightness value higher than the brightness threshold in the ultraviolet image may be directly used as the discharge intensity data P. However, the pulse voltage with high dv/dt usually has a relatively high frequency. Therefore, some partial discharge phenomenon may not be record during the detection, causing inaccuracy of the detect result. Thus, the discharge intensity data P would be adjusted from an initial intensity R, which is the sum of pixels with the brightness value higher than the brightness threshold in the ultraviolet image. In one embodiment of the present invention, the adjustment comprises two steps, referring to FIG. 4.

Step (1): correcting the initial intensity R by a correct coefficient matched with the frequency of the pulse voltage with high dv/dt, to obtain an amplified initial intensity S, to amplify a pixel number sampled at different frequencies. Since the ultraviolet image is the video frame extracted from the video data, the correct coefficient is a ratio of the number of video frames within one second to the frequency of the pulse voltage. The amplified initial intensity S is:

$$S = \frac{\frac{1}{M}}{\frac{1}{f}} \times R = \frac{f}{M} \times R$$

Wherein M represents the number of video frames acquired by the ultraviolet imager within one second.

Step (2): correcting the initial intensity based on the correct coefficient N, to obtain the discharge intensity data, $P = N \times R$. Actually, when performing the adjustment in step (1), the adjusted object is the amplified initial intensity S. Then, $P = N \times S$.

In either case, the above correct coefficient N is fit from a low frequency voltage condition. A method of fitting the correct coefficient is discussed below.

Using an ultraviolet imager to sample a reference image when the target electric system is at low frequency voltage condition, and to get a discharge repetitive rate H. The low frequency voltage condition refers to a voltage with a frequency lower than a set value, e.g., the common power frequency voltage. One skilled in the art should realize that it is supposed that all of the partial discharge at the low frequency voltage condition are record. The acquirement of the reference image is similar to that of the ultraviolet image in the above step 1. The discharge repetitive rate H is acquired by a sensor. The sensor may comprise a high frequency current partial discharge sensor, an ultra-high frequency partial discharge sensor, or a pulse current sensor.

Using a sum number of pixels with the brightness value higher than the brightness threshold in the reference image as a reference ultraviolet photon pixel point $P_0$, to get the correct coefficient $N = H/P_0$.

Step 3, obtaining a quantization result of the partial discharge of the target electric system based on the discharge intensity data P and discharge characteristic parameters.

The discharge characteristic parameters under high dv/dt pulse voltage condition comprise the frequency of the pulse voltage and a rising time of the pulse voltage. The discharge intensity of the partial discharge under high dv/dt pulse voltage condition is affected by the frequency of the pulse voltage and the rising time of the pulse voltage. Thus, these two parameters are considered in the present invention; and the quantization result Q of the partial discharge of the target electric system is:

$$Q = a \times r + b \times f + P$$

Wherein a and b are coefficients, which may be obtained from pre-experimental data. For example, using the experimental test data and a multiple linear regression method to fit and get the coefficients a and b. If the discharge intensity data P is 367.2125, the quantization result of the partial discharge Q would be: $Q = 1234.6 \times r - 26.0819 \times f + 367.2125$.

Figure 5:
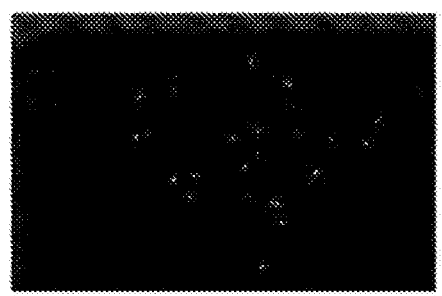
FIG. 5 schematically shows four ultraviolet images under the high dv/dt pulse voltage condition with four different discharge characteristic parameters in accordance with an embodiment of the present invention.
Figure 5:
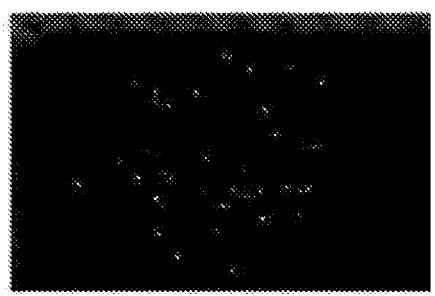
Figure 5:
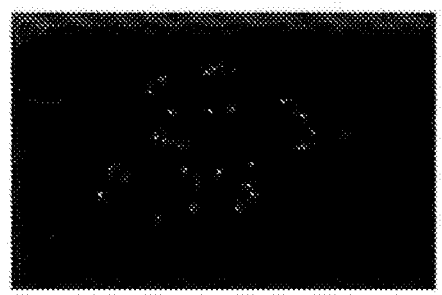
Figure 5:
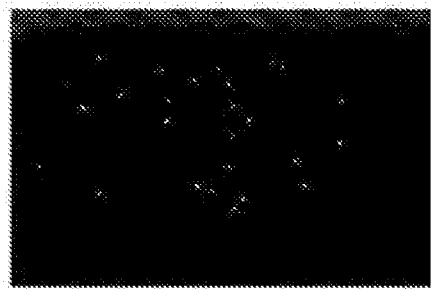

FIG. 5 schematically shows four ultraviolet images under the high dv/dt pulse voltage condition with four different discharge characteristic parameters in accordance with an embodiment of the present invention, wherein in section (a): f=1 kHz and r=50 ns; in section (b): f=1 kHz and r=100 ns; in section (c): f=1 kHz and r=200 ns; and in section (d): f=1 kHz and r=500 ns. It can be seen that the ultraviolet images in the four sections are obviously different from each other, indicating that the discharge intensity is affected by the rising time r.

Figure 6:
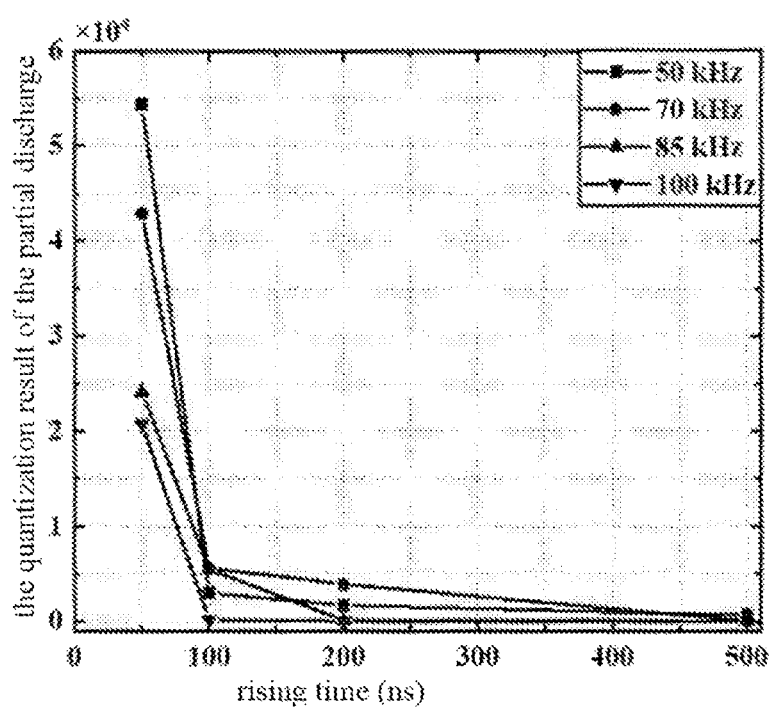
FIG. 6 schematically shows a correlation data of the quantization result of the partial discharge under high dv/dt pulse voltage condition in accordance with an embodiment of the present invention.

FIG. 6 schematically shows a correlation data of the quantization result of the partial discharge under high dv/dt pulse voltage condition in accordance with an embodiment of the present invention. As shown in FIG. 6, the quantization result of the partial discharge increases (i.e., more photon pixels are detected) as the decrease of the rising time, indicating a more severe discharge under shorter rising time. The discharge intensity within 50 ns rising time is far stronger than that under other situations. And under the same rising time, the quantization result of the partial discharge increases (i.e., a more severe discharge) as the decrease of the frequency.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

1. This written description uses examples to disclose the invention, including the best mode, and also to enable a person skilled in the art to make and use the invention. The patentable scope of the invention may include other examples that occur to those skilled in the art.

The invention claimed is:

1. A partial discharge detecting method using ultraviolet imagery under pulse voltage condition, comprising:
    sampling a video data at a partial discharge area of a target electric system by an ultraviolet imager; and obtaining an ultraviolet image by extracting video frames from the video data, the partial discharge area of the target electric system having partial discharge phenomenon under a high dv/dt pulse voltage condition, wherein v refers to a voltage information, t refers to a time information, and the high dv/dt pulse voltage refers to a pulse voltage having a voltage variation higher than a preset threshold;
    obtaining a discharge intensity data P based on a sum number of pixels with a brightness value higher than a brightness threshold in the ultraviolet image by: a) setting the sum number of pixels with the brightness value higher than the brightness threshold in the ultraviolet image as an initial intensity R, and b) correcting the initial intensity based on a correct coefficient N, to obtain the discharge intensity data P=N×R, wherein the correct coefficient N is fit from a low frequency voltage condition;
    using the ultraviolet imager to sample a reference image when the target electric system is at the low frequency voltage condition, and to get a discharge repetitive rate H; using the sum number of pixels with the brightness value higher than the brightness threshold in the reference image as a reference ultraviolet photon pixel point $P_0$, to get the correct coefficient $N=H/P_0$; and
    obtaining a quantization result Q of the partial discharge of the target electric system based on the discharge intensity data P and discharge characteristic parameters.

2. The method of claim 1, wherein the discharge characteristic parameters comprise:
    a frequency of the pulse voltage and a rising time r of the pulse voltage.

3. The method of claim 2, wherein the quantization result Q of the partial discharge of the target electric system is:

$$Q=a\times r+b\times f+P$$

wherein a and b are coefficients.

4. The method of claim 1, further comprising:
    using a sensor to acquire the discharge repetitive rate H, where the sensor comprises a high frequency current partial discharge sensor, an ultra-high frequency partial discharge sensor, or a pulse current sensor.

5. The method of claim 1, wherein the initial intensity is corrected based on the correction coefficient by:
    correcting the initial intensity R by the correct coefficient matched with a frequency of the high dv/dt pulse voltage, to obtain an amplified initial intensity S; and
    correcting the amplified initial intensity S based on the correct coefficient.

6. The method of claim 5, wherein the amplified initial intensity S is:

$$S = \frac{\frac{1}{M}}{\frac{1}{f}} \times R = \frac{f}{M} \times R$$

wherein M represents a number of video frames acquired by the ultraviolet imager within one second.

7. The method of claim 1, wherein the step of "obtaining an ultraviolet image by extracting video frames from the video data" comprises:
    randomly choosing a video frame as a candidate image from the video data;
    selecting the candidate image as the ultraviolet image if the pixels in the candidate image having the brightness value higher than the brightness threshold; otherwise, randomly choosing another video frame as the candidate image, until the ultraviolet image is selected.

8. The method of claim 1, wherein:
the ultraviolet imager has a sample time length $$T \geq \frac{100}{f},$$

wherein f refers to a frequency of the high dv/dt pulse voltage.

* * * * *

UNITED STATES PATENT AND TRADEMARK OFFICE
CERTIFICATE OF CORRECTION

| | | |
|---|---|---|
| PATENT NO. | : 12,298,338 B2 | Page 1 of 1 |
| APPLICATION NO. | : 18/125579 | |
| DATED | : May 13, 2025 | |
| INVENTOR(S) | : Jun Jiang et al. | |

It is certified that error appears in the above-identified patent and that said Letters Patent is hereby corrected as shown below:

On the Title Page

At Item (30) (Foreign Application Priority Data), please insert --Mar. 24, 2022 (CN) 202210295280.5--.

Signed and Sealed this
Twenty-second Day of July, 2025

Coke Morgan Stewart
*Acting Director of the United States Patent and Trademark Office*